United States Patent [19]

Palencher et al.

[11] Patent Number: 4,956,601
[45] Date of Patent: Sep. 11, 1990

[54] APPARATUS FOR MEASURING AN ELECTRICAL QUANTITY WITH AN ADJUSTABLE ZERO POSITION AND DOUBLE PIVOT ARRANGEMENT

[75] Inventors: Jacques Palencher, Troyes; Gabriel Jaillant, Creney Pont Sainte Marie, both of France

[73] Assignee: Radio Controle S.A., Lyons, France

[21] Appl. No.: 361,934

[22] Filed: Jun. 5, 1989

[30] Foreign Application Priority Data

Jun. 6, 1988 [FR] France ................. 88 07488
May 3, 1989 [FR] France ................. 89 05899

[51] Int. Cl.⁵ .............................. G01R 1/02
[52] U.S. Cl. ...................... 324/154 PB; 324/154 R; 324/156
[58] Field of Search ............ 324/154 R, 154 PB, 155, 324/156, 143, 146

[56] References Cited

U.S. PATENT DOCUMENTS

| 3,599,097 | 8/1971 | Palencher et al. | 324/154 R |
| 3,899,736 | 8/1975 | Sakaguchi | 324/154 R |
| 4,211,972 | 7/1980 | Boreas | 324/154 R |
| 4,751,456 | 6/1988 | Rivoir | 324/154 PB |

FOREIGN PATENT DOCUMENTS 1623839  7/1973  Fed. Rep. of Germany ...... 324/154 PB Primary Examiner—Reinhard J. Eisenzopf
Assistant Examiner—Jack B. Harvey
Attorney, Agent, or Firm—Helegott & Karas

[57] ABSTRACT

Apparatus for measuring an electrical quantity comprises a fixed body and a movable device having a pivot shaft fixed to an indicator needle which moves in front of a graduated scale. The movable device is pivotably mounted in the fixed body by pivot pins and corresponding bearings. The pivot pins are provided at the ends of the shaft while the bearings face the pins on the fixed body. The movable device is further supported relative to the fixed body by knives and corresponding bearings which receive edges of the knives. The knives are fixed to the movable device and the bearings are provided near the ends of the shaft. The edges of the knives and the pivot pins together with the corresponding bearings are aligned with each other.

8 Claims, 2 Drawing Sheets

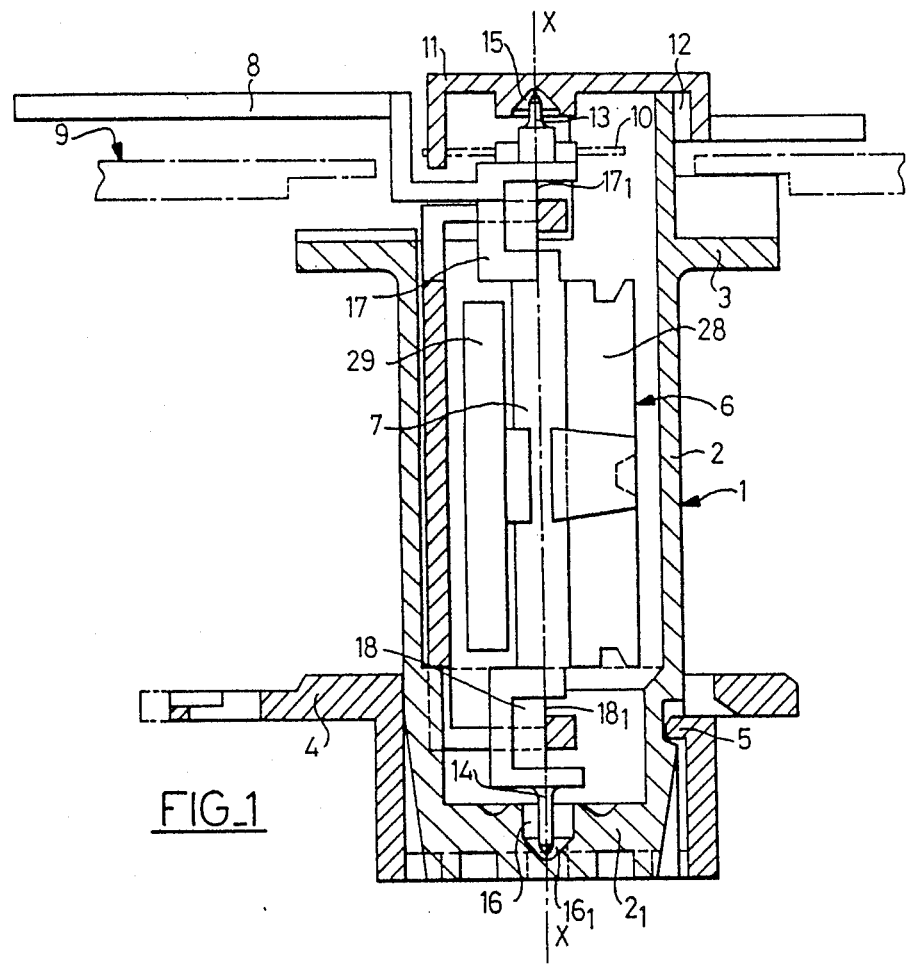
FIG_1
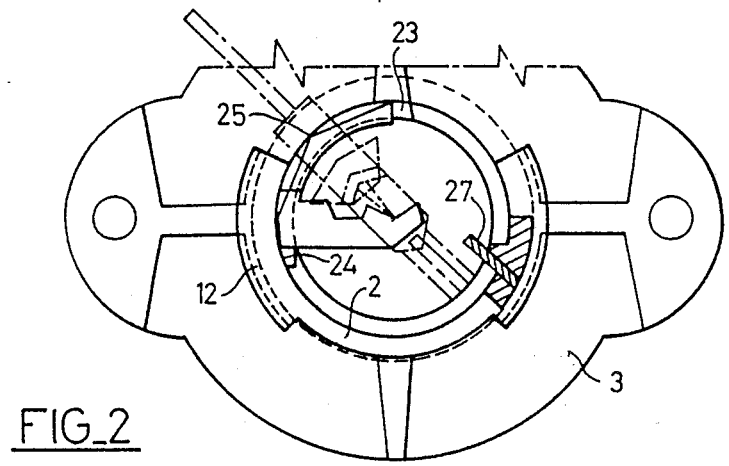
FIG_2

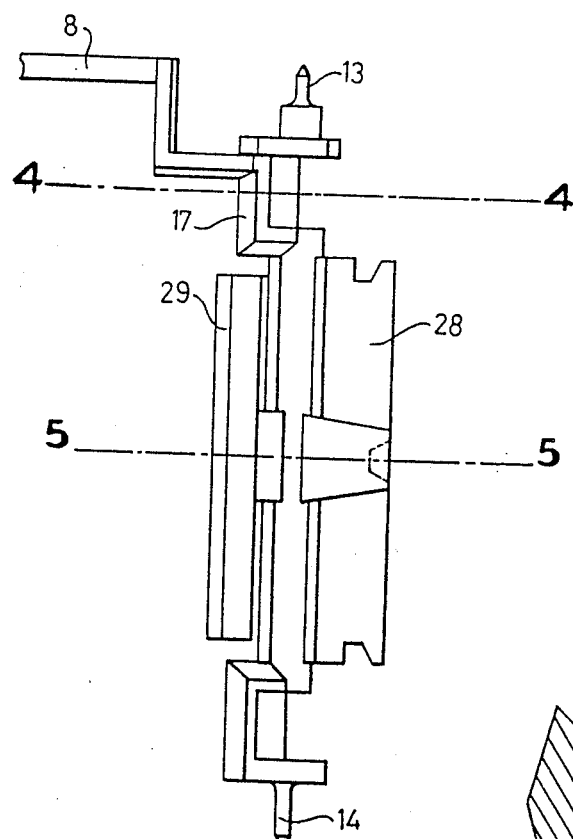
FIG_3
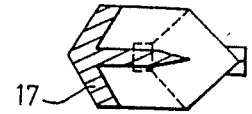
FIG_4
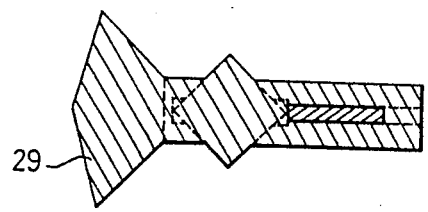
FIG_5
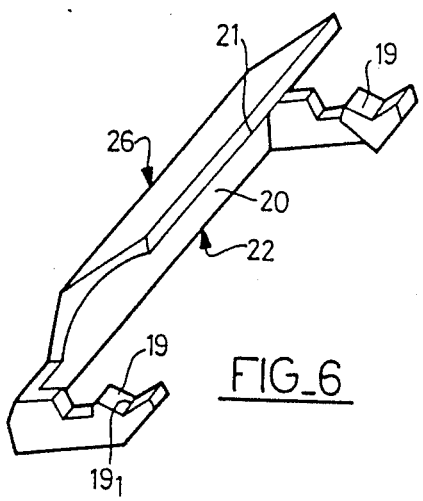
FIG_6
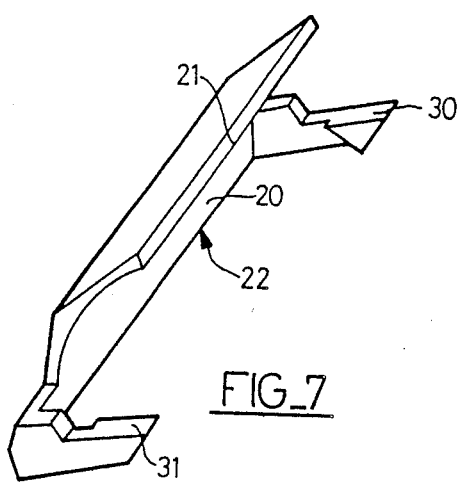
FIG_7

APPARATUS FOR MEASURING AN ELECTRICAL QUANTITY WITH AN ADJUSTABLE ZERO POSITION AND DOUBLE PIVOT ARRANGEMENT

BACKGROUND OF THE INVENTION

The invention relates to apparatus for measuring an electrical quantity.

The sensitivity and precision of an apparatus provided with a movable device for measuring an electrical quantity depend largely on the method of pivoting used.

this pivoting is currently achieved by pivot pins which are formed at the ends of the shaft of the movable device and which are applied to corresponding bearings formed facing each other on the body of the apparatus.

However, this method of pivoting can be considered excellent only when it is used in apparatus which is read horizontally, that is which has a vertical shaft, and if the pivot pins and the corresponding parts are made of metal.

In order to reduce cost attempts are currently being made to produce equipment for measuring electrical quantities in which most of the constituent parts, and particularly the movable device, are made from plastics material, it also being necessary for the measuring equipment to have good precision and sensitivity both for horizontal reading and for vertical reading, that is to say for use as a so-called "table" meter.

SUMMARY OF THE INVENTION

It is an object of the present invention to resolve the above problems and for this purpose the apparatus is provided for measuring an electrical quantity, including a fixed body and a movable device, a pivot shaft of which is firmly fixed to an indicator needle which moves in front of a graduated scale, wherein the movable device is pivotably mounted on the fixed body, by pivot pins and corresponding bearings, the former being provided on the ends of the shaft and the latter facing the pins on the fixed body, and, also, by knives and corresponding bearings, the former being fixed to the shaft and the latter being fixed to the body, the knife-edges and the pivot points together with the corresponding bearings being aligned.

According to another characteristic of the invention, the two kinfe-edges or their bearings are formed in a single part arranged on the fixed body of the apparatus.

According to still another characteristic of the invention, the fixed body is constituted by a spool the hollow body of which pivotably houses the movable device, the part forming the knife-edges or their bearings being constituted by a yoke fixed to the inner wall of the hollow body.

The invention is shown by way of non-limiting example in the appended drawings.

BRIEF DESCRIPTION OF THE DRAWINGS

FIG. 1 is an axial section of the apparatus according to the invention;

FIG. 2 is a top plan view of the apparatus of FIG. 1, with a regulating lever being removed and the movable device being shown in broken lines;

FIG. 3 is a side view of the movable device of the the apparatus of FIG. 1;

FIGS. 4 and 5 are sections taken on the lines 4—4 and 5 —5 of FIG. 3;

FIG. 6 is a perspective view of the yoke forming the bearings for the knives shown in the embodiment of FIGS. 1 and 2;

FIG. 7 is a perspective view of another embodiment of the yoke.

DETAILED DESCRIPTION OF THE PREFERRED EMBODIMENTS

The object of the present invention is, therefore, to provide a very sensitive and accurate measuring apparatus, of which almost all the constituent parts, and particularly the pivot members, can be made of plastics material, the apparatus being usable equally well in horizontal or vertical position.

The structure of the apparatus shown in the appended drawings is comprised essentially of a spool 1 whose body 2 is hollow and fixed to one end of the flanges denoted at 3, the other flange 4 being snap-engaged at 5 with the other end of the body 2. The spool, which constitutes the support for a winding of metal wire, not shown, is moulded from plastics material.

A movable device 6 is pivotably mounted inside the hollow body 2 of the spool and comprises essentially a shaft 7 fixed to an indicator needle 8 which moves in front of the graduated scale 9.

The needle 8 of the movable device is returned to zero by a spiral 10 whose inner end is fixed to the shaft 7 and whose outer end is fixed to a regulating lever 11 made of plastics material. This regulating lever is coupled by a bayonet fitting 12 to the end of the body 2 so that the regulating lever 11 can be pivoted about axis X—X of the body 2 in order to adjust the zero position of the needle 8 in front of the graduated scale 9. The pivoting of the movable device is ensured by a double pivot arrangement comprising, on the one hand, pivot pins and, on the other hand, knife-edges.

Thus, in the appended drawings, the shaft 7 of the movable device is provided at the ends thereof with pivot points or pins 13 and 14 having conical ends. The pin 13 is located in a generally-cinical housing 15 formed in the regulating lever 11. The pivot pin 14 is located in a generally-cylindrical housing 16 so that it bears against a conical bearing $16_1$ at the end of the cylindrical housing 16.

Adjacent its ends, the shaft 7 is further provided with two knives 17 and 18 whose edges $17_1$, $18_1$ bear against the edges $19_1$ provided at the intersection of dihedral-shaped bearings 19 which are formed integrally by moulding during the production of a yoke-shape part 20 of plastics material (FIG. 6). The part 20 has two parallel edge faces 21 and 22 formed so as to bear against respective ribs 23 and 24 (FIG. 2) which project from the inner wall of the body, parallel to the axis X—X.

Moreover, the yoke 20 is formed so that the edges $19_1$ of the dihedral bearings 19 are located exactly on the axis X—X of the body 2, that is, in aligment with the pivot pins 13, 14 when the yoke is positioned between the ribs 23, 24.

In the embodiment shown in FIG. 2, a third reb 25 is provided, which projects from the inner wall of the body 2 between the ribs 23, 24. The rib 25 is intended to abut a sharp edge 26 of the yoke 20 in order to position the edges $19_1$ of the dihedral bearing 19 exactly on the axis X—X of the body 2.

In the embodiment of FIG. 7, the yoke 20 has two flat surfaces 30 and 31 which replace the dihedral-shape bearings 19 of FIG. 6.

The use of flat surfaces 30 and 31 to form the bearing surfaces for the edges 17₁, 18₁ of the knives 17, 18 improves the sensitivity of the apparatus and its precision by cancelling out the detrimental effects of even minor faults of aligment between the pivot pins 13, 14, the housings 15, 16 the knife-edges 17, 18 and the surfaces 30 and 31, which may occur during manufacture.

The surfaces 30 and 31 are likewise preferably oriented in the body 2 so that an imaginary axis passing across both surfaces 30 and 31 passes substantially through the center of the graduated scale 9 of the measuring apparatus.

In the embodiments shown, the measuring device comprises ferromagnetic equipment and the body 2 of the spool includes a metal blade 27 which cooperates with the metal blade 28 fixed to the shaft 7. The shaft 7, which is also made of plastics material, has incorporated in it during moulding not only the needle 8 but also a counterweight 29 which substantially balances the weight of the blade 28.

It can thus be seen that, in the construction described, the movable device includes a double pivot arrangement comprising, on the one hand, pivot pins 13, 14 and, on the other hand, knife-edges 17, 18 and is formed in such a manner that most of the constituent parts of the apparatus are of plastics material and the apparatus has good sensitivity whatever the position of the measuring part thereof is.

It will also be noted that, from a structural point of view, the rounding off of the ends or tops of the pins 13, 14, the bearings 15, 16, the knife-edges 17, 18 and the bearings 19 will be determined in each case in dependence on the plastics material used and, in particular, on its hardness.

In order to damp the pivoting of the needle 8, a viscous material may also be placed in the housing 16 so as to cooperate with the pivot pin 14 in order to slow the pivoting of the movable device 6.

We claim:

1. Apparatus for measuring an electrical quantity, comprising a fixed body and a movable device having a pivot shaft fixed to an indicator needle which moves in front of a graduated scale, and pivoting means for pivotally mounting said movable device to said fixed body, said pivoting means including pivot pins provided on two opposing ends of said shaft and first bearings provided on said fixed body for receiving said pivot pins, and knives having knife edges and fixed to said shaft adjacent said ends thereof and second bearings fixed to said body for receiving said knife edges, said knife edges and said pivot pins together with said first and second bearings being aligned with each other.

2. Apparatus according to claim 1, wherein said knives are made of one piece.

3. Apparatus according to claim 1, wherein said second bearings are provided in one and the same piece arranged on said fixed body.

4. Apparatus according to claim 3, wherein said fixed body includes a hollow spool pivotally housing said movable device, said piece being formed as a yoke fixed to an inner wall of said hollow spool.

5. Apparatus according to claim 4, wherein said second bearings are formed by flat surfaces provided in said yoke.

6. Apparatus according to claim 5, wherein said flat surfaces are oriented in said fixed body so that an imaginary axis passing across both said flat surfaces passes substantially through a center of said gradiated scale.

7. Apparatus according to claim 3, wherein said second bearings are formed by flat surfaces provided in said piece.

8. Apparatus according to claim 1, wherein said fixed body includes a hollow spool pivotally housing said movable device, said knives being provided in one and the same piece formed as a yoke.

* * * * *